United States Patent
Lee et al.

(10) Patent No.: US 8,873,067 B2
(45) Date of Patent: Oct. 28, 2014

(54) INTERFEROMETER FOR TSV MEASUREMENT AND MEASUREMENT METHOD USING SAME

(75) Inventors: Ki Hun Lee, Seoul (KR); Heung Hyun Shin, Seoul (KR); Heui Jae Pahk, Seoul (KR)

(73) Assignee: Snu Precision Co., Ltd., Seoul (KR)

( * ) Notice: Subject to any disclaimer, the term of this patent is extended or adjusted under 35 U.S.C. 154(b) by 0 days.

(21) Appl. No.: 14/111,197

(22) PCT Filed: Apr. 13, 2012

(86) PCT No.: PCT/KR2012/002843
§ 371 (c)(1),
(2), (4) Date: Oct. 11, 2013

(87) PCT Pub. No.: WO2012/141544
PCT Pub. Date: Oct. 18, 2012

(65) Prior Publication Data
US 2014/0036273 A1 Feb. 6, 2014

(30) Foreign Application Priority Data
Apr. 13, 2011 (KR) .................... 10-2011-0034264

(51) Int. Cl.
| G01B 9/02 | (2006.01) |
| G01J 3/45 | (2006.01) |
| G01B 9/021 | (2006.01) |
| G01B 11/02 | (2006.01) |
| H01L 21/66 | (2006.01) |
| G01B 11/24 | (2006.01) |

(52) U.S. Cl.
CPC ............. G01B 11/24 (2013.01); H01L 22/12 (2013.01); G01B 2210/56 (2013.01)
USPC ........... 356/511; 356/450; 356/516; 356/512; 356/495; 356/504; 356/513; 356/451; 356/521

(58) Field of Classification Search
CPC ...... G01B 11/24; G01B 11/026; G01B 11/02; G01B 11/08; G01B 2210/56
USPC ................................. 356/450–521
See application file for complete search history.

(56) References Cited

U.S. PATENT DOCUMENTS

| 5,561,525 A * | 10/1996 | Toyonaga et al. ............ 356/512 |
| 7,924,435 B2 | 4/2011 | Colonna De Lega et al. |
| 8,069,008 B2 | 11/2011 | Kusunose |
| 2007/0046953 A1 * | 3/2007 | De Groot et al. ............ 356/512 |

OTHER PUBLICATIONS

Abstract of Korean Patent—KR20100123519, Nov. 24, 2010, 1 page.

* cited by examiner

*Primary Examiner* — Tarifur Chowdhury
*Assistant Examiner* — Sunghee Y Gray
(74) *Attorney, Agent, or Firm* — Dority & Manning, P.A.

(57) ABSTRACT

Provided herein is a TSV measuring interferometer that uses a variable field stop that adjusts such that a light is focused at an inlet and at a bottom surface of a TSV when measuring a diameter and depth of the TSV, thereby reducing a measurement time and result data, the interferometer also using a telecentric lens that adjusts the light injected into the TSV to be a straight line, so as to obtain a sufficient amount of light reaching the bottom surface to improve the accuracy of measurement even in a TSV having a large aspect ratio.

6 Claims, 6 Drawing Sheets

Prior Art

INTERFEROMETER FOR TSV MEASUREMENT AND MEASUREMENT METHOD USING SAME

CROSS REFERENCE TO RELATED APPLICATION

This application is the national stage entry of International Patent Application No. PCT/KR2012/002843 having a filing date of Apr. 13, 2012, which claims priority to and the benefit of Korean patent Application No. 10-2011-0034264 filed in the Korean Intellectual Property Office on Apr. 13, 2011, the entire contents of which are incorporated herein by reference.

BACKGROUND

1. Field

The following description relates to an interferometer for measuring a TSV and a measurement method using the same, for example, to an interferometer that comprises a variable field stop and thus is capable of measuring a diameter and length of a via hole having a large aspect ratio such as a TSV (Through Silicon Via) formed on a silicon semiconductor, and a measurement method using the same.

2. Description of Related Art

Recently, in the semiconductor field as well, 3-dimensional chips are emerging as alternatives to overcome the limitations of 2-dimensional refining technologies having limited chip size area.

The concept of a 3-dimensional structure has already been in use in the packaging industry. However, according to existing methods, various terminals are disposed in only one surface of a semiconductor chip, and it is necessary to electrically connect signal terminals of a plurality of chips using wire bonding. Therefore, there are problems in terms of size of the chips, complexity of wiring, and electricity consumption etc.

Therefore, in order to overcome these problems, TSV (Through Silicon Via) technology was proposed where an electrode is formed such that it penetrates a silicone that is the material of semiconductor substrate, thereby providing a signal transduction pathway just as an elevator in a high rise building.

Such a TSV technology is expected to be effective in terms of the degree of circuit agglomeration, operating speed, power consumption, and manufacturing cost etc., and thus researches are being concentrated in the TSV technology.

Conventional interferometers are used as TSV measurement apparatuses for forming and inspecting the state of formation of the TSVs.

The most representative interferometer is White Light Interferometer (WLI) that splits the light coming out from one light source into two lights, makes the two lights proceed at a perpendicular angle from each other and then makes them meet each other, and then forms interference fringes by the optical path difference of the two lights.

Using the above principle, it is possible to measure the characteristics of the surface topology of a thin film such as a silicone semiconductor wafer.

FIG. 1 is a schematic view of a white light interferometer. With reference to FIG. 1, a white light interferometer splits the light generated from light source 110 in two directions that are perpendicular to each other through a beam split 120, reflects one of the split light through a mirror 130, while reflecting the other split light through a measurement object 140, and then makes the two reflected lights to be re-injected into the beam split.

Next, the lights re-infected into the beam split 120 are combined with each other as they pass the beam split 120, and interference fringes are formed on a CCD 150 through an object lens 170 and relay lens (not illustrated).

Herein, by the piezoelectric sensor 180, the object lens 170 is moved in an optical path direction, thereby adjusting the optimal focal length of the object lens 170.

Herein, since white light has a short interference distance, when measuring a certain amount of white light regarding a measurement object, interference phenomenon occurs starting from the highest place of the measurement object. That is, the interference fringes occur only at the optimal focal length of the object lens 170.

Therefore, it is possible to identify which part is high and which part is low by checking the changes in the light intensity of an unknown measurement object. Herein, the height of the measurement object may be obtained by an analyzing means.

That is, based on the interference fringes, one can know which part is high and which part is low. Herein, the heights can be measured through the piezoelectric sensor 180.

In the aforementioned interferometer, it is possible to use the piezoelectric sensor 180 to move the object lens 170 in the direction of the measurement object so that an image is formed on the CCD at every certain interval.

Using the interferometer, when measuring the surface of a thin film such as a wafer, it is possible to analyze the height of the measurement object after moving the piezoelectric sensor 180 once.

However, in the case of a conventional interferometer, when a wide-angle lens is used to inject light to TSV, the incidence angle of the light injected into the TSV is bigger than the diameter of the via hole, and thus only a small amount of light is actually injected inside the TSV. Consequently, the light may not reach the bottom surface.

Furthermore, even when the light source was replaced so as to increase the intensity of the light reaching the bottom surface, since the focus of light has to be measured at every certain distance in the direction of the TSV, it takes a long time to measure the focus of the light, increasing the capacity of the result data, thereby overloading the entire system.

SUMMARY

Technical Task

The purpose of the present disclosure is to resolve the aforementioned problem, that is, to provide an interferometer that is capable of measuring a diameter and length of a TSV using a variable field stop that adjusts the focus of light to the inlet and to the bottom surface of the TSV so as to reduce the measurement time and capacity of the result data, and a measurement method using the same.

Another purpose of the present disclosure is to provide an interferometer that enables obtaining a sufficient amount of light to reach the bottom surface of a TSV that has a large aspect ratio, using a telecentric lens that adjusts the light entering the TSV to be substantially a straight light, and a measurement method using the same.

Technical Resolutions

In one general aspect, there is provided an interferometer for measuring a TSV, the interferometer comprising: a beam splitter configured to split an injected light generated from a light source, output two split lights in a first direction and second direction, respectively, that are perpendicularly to each other, and combine two split lights re-input from the first direction and second direction, and output a combined light; a mirror configured to reflect the split light input from the beam splitter back to the beam splitter and disposed in the first direction, and a measurement object where at least one TSV is formed and configured to reflect the split light input from the beam splitter back to the beam splitter and disposed in the second direction; a photographing means configured to receive the combined light output from the beam splitter after being reflected from the mirror and measurement object, and where an interference signal is formed by the combined light; an object lens disposed between the beam splitter and photographing means or between the beam splitter and measurement object; and a variable field stop disposed between the beam splitter and photographing means, and controls the split light towards the measurement object to be focused at a reference location that is an inlet of the TSV or at a variable location that is a bottom surface of the TSV, wherein the interferometer may measure a diameter and height of a TSV based on an interference signal when the split light towards the measurement object is focused at the reference position and an interference signal when the split light towards the measurement object is focused at the variable position.

In the general aspect of the interferometer, the light output from the object lens may be a straight light, and the object lens may be a telecentric lens.

In the general aspect of the interferometer, the variable field stop may comprise a first opening configured to focus the light split from the beam splitter at the reference location that is the inlet of the TSV, and a second opening configured to focus the light split from the beam splitter at the variable location that is the bottom surface of the TSV.

In the general aspect of the interferometer, a size of the first opening may be between 10 mm to 14 mm, and a size of the second opening may, be between 0.1 mm to 4.5 mm. And the size of the first opening or the second opening may change by the height of diameter of the hole.

In another general aspect, there is provided a measurement method using an interferometer for measuring a TSV, the method comprising: having the split light towards the measurement object to be focused at a reference location that is an inlet of a TSV formed on the measurement object; generating a light, splitting the light through the beam splitter, and receiving two reflected lights and combining the two received lights to form a first interference signal; adjusting a variable field stop so that the split light towards the measurement object is focused at a variable location that is a bottom surface of the TSV formed on the measurement object; generating a light, splitting the light through the beam splitter, receiving two reflected lights and combining the two received lights to form a second interference signal; and analyzing the first interference signal and second interference signal to measure a diameter and depth of the TSV.

In the general aspect of the method, the light output to the measurement object may be a straight light.

Advantageous Effects

According to the present disclosure, there is provided a TSV measuring interferometer that enables measuring the diameter and length of a TSV using a variable field stop that adjusts the focus of light to the inlet and to the bottom surface of the TSV thereby reducing the measurement time and capacity of result data, and a measurement method using the same.

Furthermore, there is provided a TSV measuring interferometer that enables obtaining sufficient amount of light to reach the bottom surface even in a TSV having a large aspect ratio using a telecentric lens that makes the light entering the TSV substantially a straight light, and a measurement method using the same.

Figure 1:
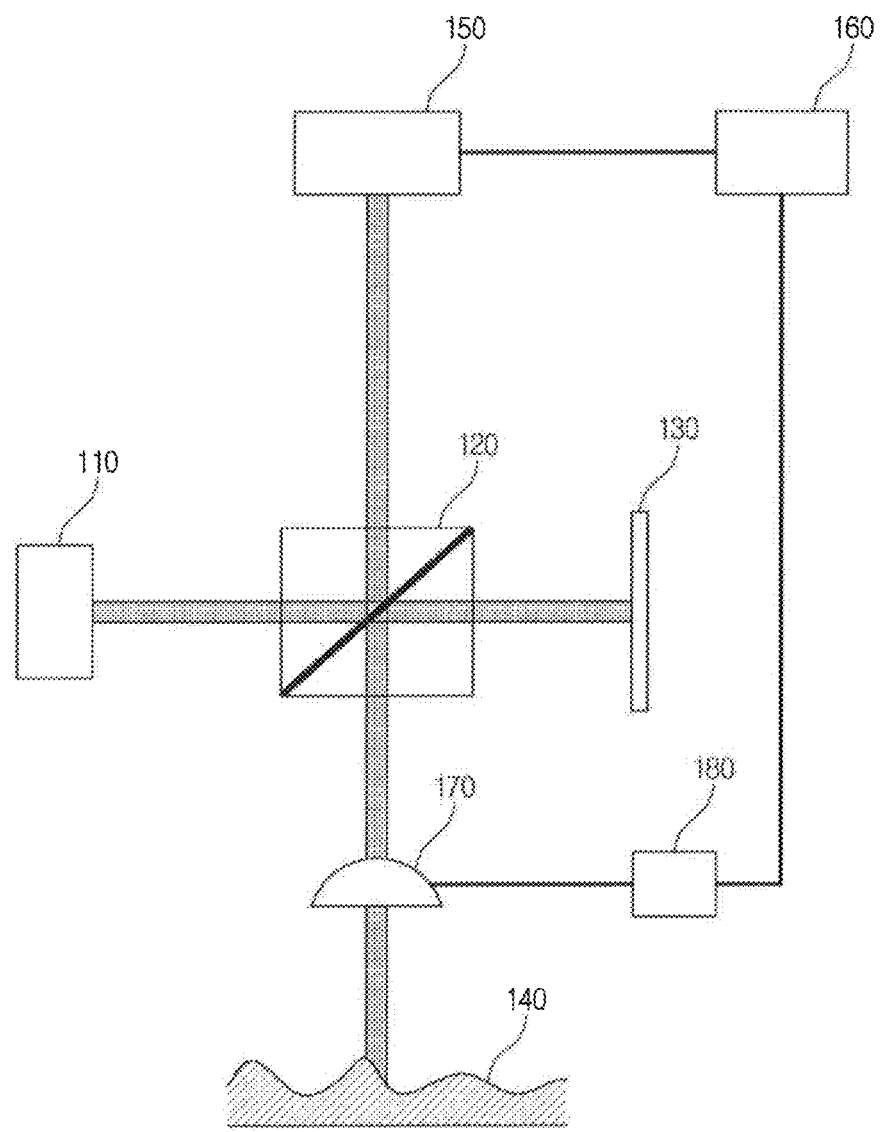
FIG. 1 is a schematic view of a white light interferometer.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

Figure 2:
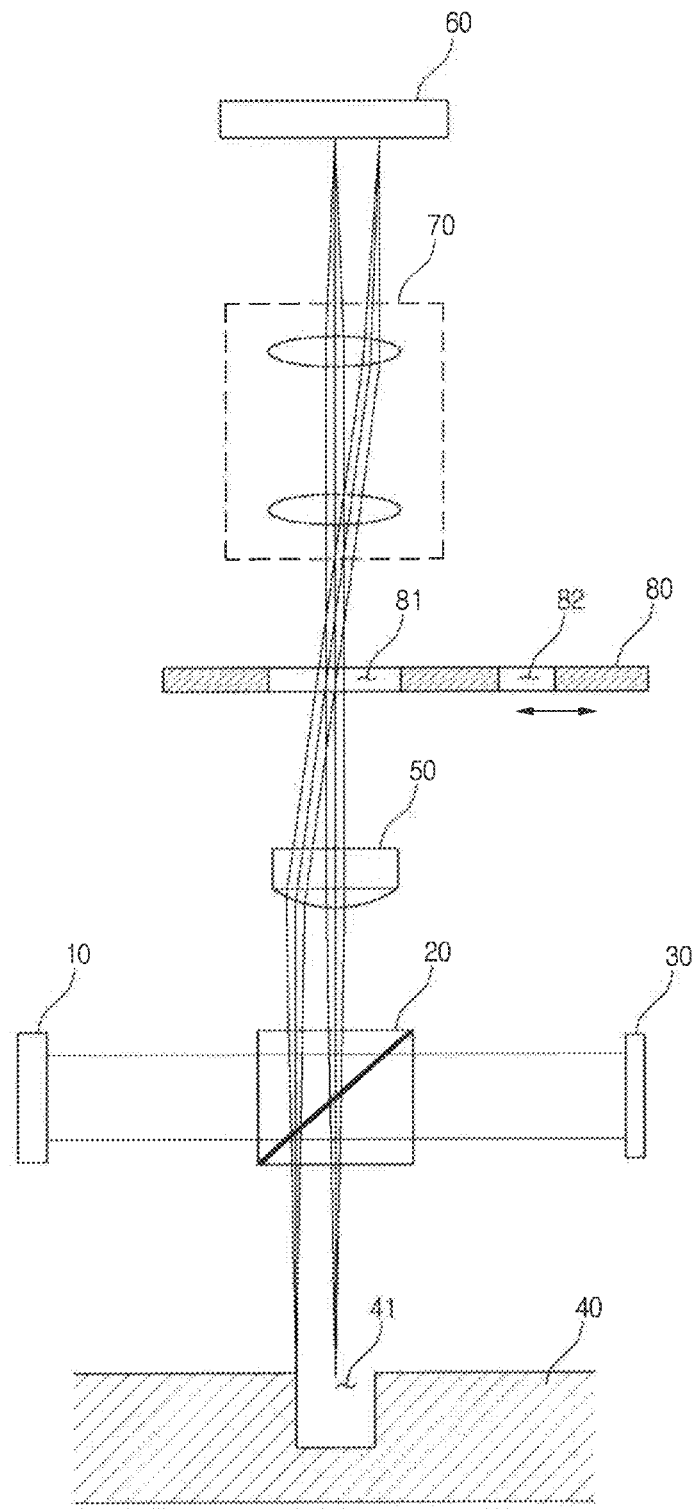
FIG. 2 is a schematic view of an interferometer for measuring a TSV according to a first exemplary embodiment of the present disclosure.

FIG. 2 is a schematic view of an interferometer for measuring a TSV according to a first exemplary embodiment of the present disclosure. With reference to FIG. 2, a TSV measuring interferometer according to an exemplary embodiment of the present disclosure comprises a light source 10, beam splitter 20, mirror 30, object lens 50, photographing means 60, relay lens 70, and variable field stop 80.

The light source 10 is the most important element that determines the depth resolution and height of penetration of an interferometer. The light source 10 may a broadband light source with a short coherence length.

More specifically, the light source may be a continuous light source such as a Light Emitting Diode (LED), superluminescent diode (SLD), halogen lamp, microwave pulse laser, or photonic crystal fiber (PCF) etc. It may also be a high-speed frequency-sweeping laser where the frequency changes quickly in a broadband range so as to enable high-speed image acquisition, such as a Fourier domain mode-locked laser source.

Laser or LED etc. such as short waves having long coherence lengths may also be a light source.

The beam splitter 20 is installed such that a light generated from the light source 10 may be spilt in a first direction and a second direction that are perpendicular to each other. The beam splitter 20 combines two lights that are reflected by a mirror 30 and a measurement object 40, respectively, and outputs a combined light.

The mirror 30 and measurement object 40 are each disposed in a first direction and second direction, respectively, such that the light output from the beam splitter 20 may be reflected back to the beam splitter 20.

As illustrated, the mirror 30 is installed in the left side of the beam splitter 20, and the measurement object 40 is disposed in the second direction that is perpendicular to the first direction, that is, in the lower side of the beam splitter 20.

The object lens 50 is provided as a telecentric lens having a plurality of lens so that the light injected therein may be output as a straight light (parallel) light. The object lens is installed between the beam splitter 20 and a photographing means 60 to be explained hereinafter or between the beam splitter 20 and the measurement object 40.

In the present disclosure, the light output from the object lens 50 is output as a straight light, and thus the object lens 50 may be disposed between the beam splitter 20 and the photographing means unlike in the conventional technology. In the present exemplary embodiment, the object is installed between the beam splitter 20 and the photographing means 60.

By using the object lens 50 provided by telecentric lens, even when the TSV 41 of the measurement object 40 has a large aspect ratio, the light can reach the bottom surface of the TSV 41 unlike in the conventional technology of using a wide angle lens.

The photographing means 60 is a conventional CCD camera that receives the light reflected by the mirror 30 and the measurement object 40 and then combine them in the beam splitter 20 to form an interference signal.

In addition, the interference signal obtained from the photographing means 60 is analyzed through a predetermined analyzing means, and thus based on the interference signal, it is possible to measure the diameter and length of the measurement object 40.

The relay lens 70 is disposed between the variable field stop 80 to be explained hereinafter so as to relay the light.

The variable field stop 80 may be provided with a first opening 81 and a second opening 82. Herein, the first opening 81 has a size such that the split light can be focused at a reference location that is the inlet of the TSV 41 of the measurement object 40, while the second opening 82 has a size such that the split light can be focused at a variable location that is the bottom surface of the TSV 41 of the measurement object 40.

In the present exemplary embodiment, the variable field stop 80 has two openings, but may have an aperture form used in a conventional camera to control the openings.

Furthermore, the variable field stop 80 is connected with a driving means (not illustrated) having a predetermined motor, and thus moves the location of the first opening 81 and the second opening 82.

It is possible to obtain an interference signal at the reference location and an interference signal at the variable location while changing the location of the first opening 81 and the second opening 82, and combine the results of each interference signal obtained to measure the height and width of the TSV 41 formed on the measurement object 40.

Figure 3:
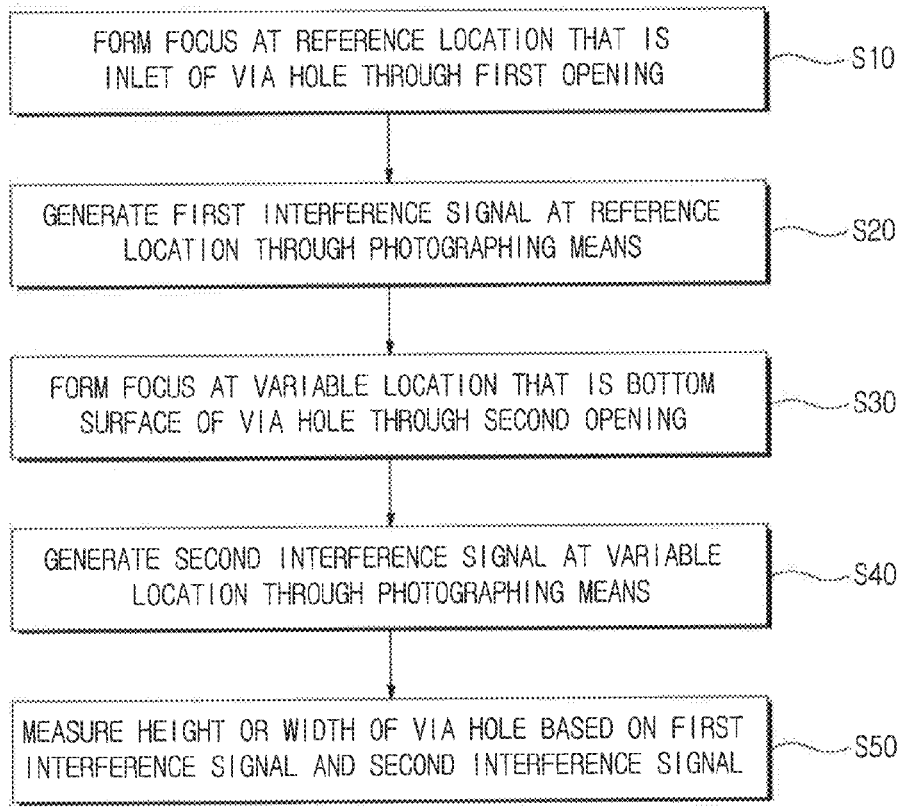
FIG. 3 illustrates an algorithm of a measurement method using a TSV measuring interferometer for measuring a TSV according to a first exemplary embodiment of the present disclosure.
Figure 4:
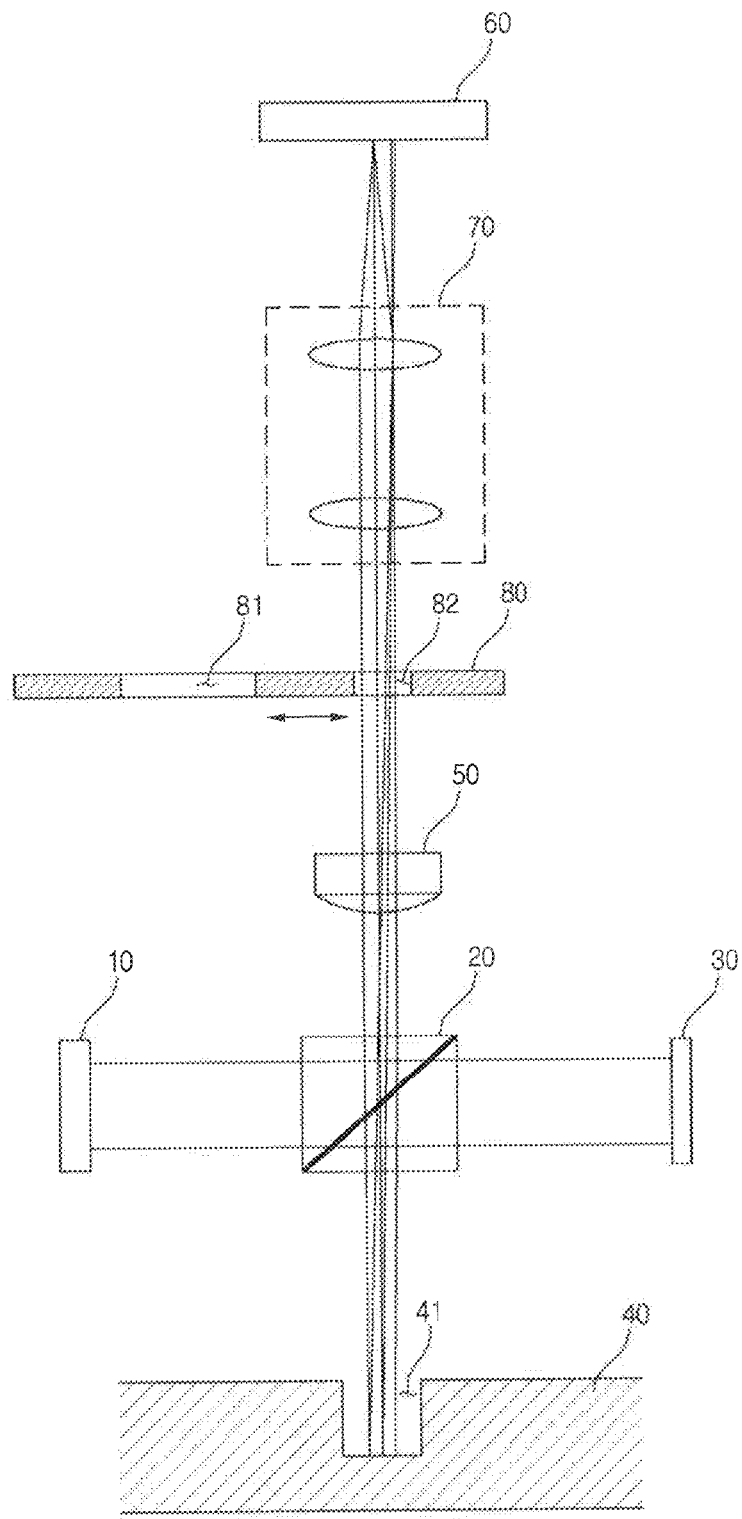
FIG. 4 is an operation state view when moving a field stop.

Hereinbelow is explanation on a measurement method using the aforementioned interferometer for measuring a TSV, FIG. 3 illustrates an algorithm of a measurement method using an interferometer for measuring a TSV according to a first exemplary embodiment of the present disclosure; and FIG. 4 illustrates an operation state view when moving a field stop.

With reference to FIG. 3, at a preparation state such as in FIG. 2, the first opening 81 of the variable field stop 80 is disposed such that the light is focused at a reference location that is the inlet of the TSV 41 formed on the measurement object 40 (S10).

In addition, a light is generated from the light source 10, the light is split through the beam splitter 20, and then the lights reflected by the reference location of the TSV 41 of the measurement object 40 and the mirror 30 are combined by the beam splitter 20, forming a first interference signal on the photographing means 60.

Next, as illustrated in FIG. 4, the light is made to penetrate through the second opening 82 of the variable field stop 80, such that the split light is focused on the variable location that is the bottom surface of the TSV 41 (S30).

Furthermore, a light is generated from the light source 10, the light is split through the beam splitter 20 and output, and then the lights reflected through the reference location of the TSV 41 of the measurement object 40 and the mirror 30 are combined by the beam splitter 20, to form a second interference signal on the photographing means 60.

Next, the analyzing program that analyzes interference signals combines the first interference signal and second interference signal formed on the photographing means 60 using the installed analyzing means to measure the diameter and height of the TSV 41.

As aforementioned, it is possible to measure the diameter and height of the TSV 41 by measuring the reference location and variable location of the TSV 41 only twice, thereby reducing the capacity of the result data and preventing overloading of the system.

In addition, according to conventional methods, the object lens 50 was a wide-angle lens and thus was incapable of measuring a TSV having a large aspect ratio, but in the present disclosure, the object lens 50 is a telecentric lens which significantly increases the amount of light entering the TSV, thereby being capable of measuring the TSV.

EXPERIMENTAL EXAMPLE 1

Figure 5:
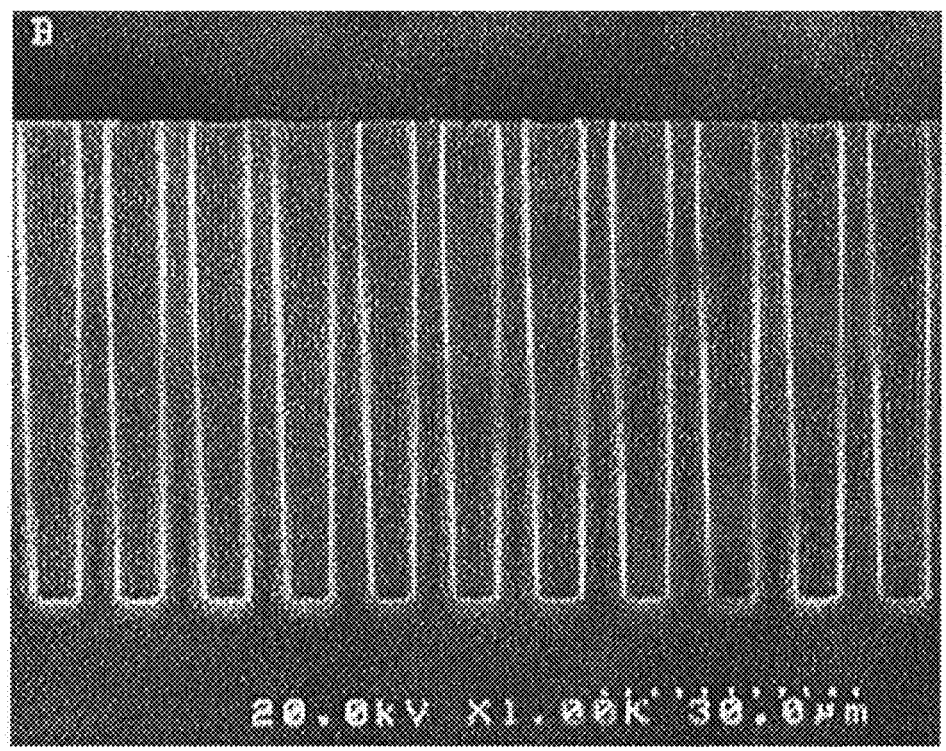
FIGS. 5 and 6 are SEM images of the TSV according to each of the experimental examples.

A substrate having a TSV was prepared, and a Scanning Electron Microscope (SEM) image was obtained as illustrated in FIG. 5 using a scanning electron microscope, and the diameter and height of the TSV was directly measured from the SEM image.

Furthermore, the diameter and height of the TSV was measured while sequentially scanning the TSV divided into sections through the interferometer using a conventional piezoelectric sensor of FIG. 1.

In addition, a first interference signal was obtained by using the variable field stop 80 of the interferometer measuring TSV such that the light is focused at the reference location (Top CD) that is the inlet of the TSV, and a second interference signal was obtained by using the variable field stop 80 such that the light is focused at the bottom CD that is the bottom surface of the TSV, so as to measure the diameter and height of the TSV through a predetermined analyzing program.

The values according to the SEM image, a conventional interferometer, and a TSV measuring interferometer are as shown below.

TABLE 1

| | Top CD (μm) | Bottom CD (μm) | Height (μm) |
|---|---|---|---|
| Experimental value of SEM image | 7 | 6 | 55 |
| Measured value of a conventional interferometer | 7.0358 | — | — |

TABLE 1-continued

|  | Top CD (μm) | Bottom CD (μm) | Height (μm) |
|---|---|---|---|
| Measured value of an interferometer of the present disclosure | 7.1556 | 6.1118 | −54.2293 |

Based on the SEM image, the diameter of the inlet of the TSV (Top CD) was measured as 7 μm, the diameter of the bottom surface of the TSV (Bottom CD) as 6 μm, and the height of the TSV as 55 μm.

When using the conventional interferometer, the diameter of the inlet of the TSV (Top CD) was measured as 7.0358 μm, but in the case of the bottom surface of the TSV, an interference signal was not formed, and thus it was impossible to measure the diameter. Accordingly, it was impossible to measure the height of the TSV either.

In addition, using the TSV measuring interferometer according to the present disclosure, the diameter of the inlet of the TSV (Top CD) was 7.1556 μm, the diameter of the bottom surface of the TSV (Bottom CD) 6.1118 μm, and the height −53.2293 μm.

The aforementioned value has a negative(−) value since the substrate surface is used as the reference location of the via hole measurement device using the interferometer of the present disclosure.

Using the TSV measuring interferometer according to the present disclosure, it became possible to measure the diameter of the bottom surface of the TSV which was not possible when using a conventional interferometer. Accordingly, it also became possible to measure the height of the TSV.

Herein, the measurement value by the TSV measuring interferometer of the present disclosure may be somewhat different from the actually measured value, but this is within the permissible tolerance, and thus the two values can be regarded as substantially the same.

EXPERIMENTAL EXAMPLE 2

Figure 6:
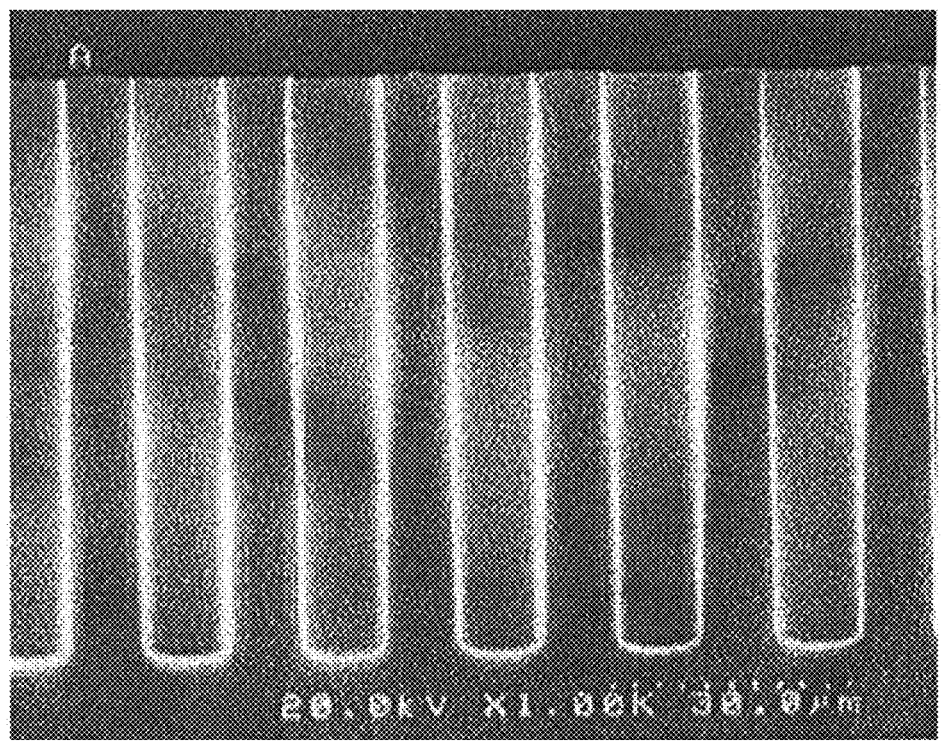

A substrate having a TSV of a different shape from experimental example 1 was prepared, and an experiment was conducted in the same method as experimental example 1. As a result, an SEM image was obtained as in FIG. 6. Next, the TSV was actually measured based on the obtained SEM image as illustrated in FIG. 6, and the TSV was measured to obtain the measurement values as shown below using the conventional interferometer as illustrated in FIG. 1 and the TSV measuring interferometer of the present disclosure.

TABLE 2

|  | Top CD (μm) | Bottom CD (μm) | Height (μm) |
|---|---|---|---|
| Experimental value of SEM image | 11 | 10 | 65 |
| Measured value of a conventional interferometer | 11.0862 | 6.2675 | −53.4829 |
| Measured value of an interferometer of the present disclosure | 11.1556 | 10.1995 | −64.5011 |

In the experimental example 2, the measured values are more close to the actually measured values. This means that the measurements were more accurate as the diameter of the TSV got bigger.

Furthermore, as the diameter of the TSV got bigger, it was still possible to measure the diameters and heights of the TSV using a conventional interferometer, but the accuracy of measured values were much lower than the measure values of the interferometer according to the present disclosure.

Therefore, when measuring the TSV using a TSV measuring interferometer according to the present disclosure, it was possible to obtain more accurate values than when using a conventional interferometer by having the light to be focused at the reference location and variable location of the TSV.

Furthermore, a TSV measuring interferometer of the present disclosure measures two places, that is, the inlet and bottom surface of the TSV, whereas a conventional interferometer has to divide the TSV into sections and then sequentially measure the sections. Accordingly, the capacity of the result data of the interferometer of the present disclosure may be significantly reduced.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

<Industrial Availability>

According to the present disclosure, there is provided a TSV measuring interferometer that may measure the diameter and height of a TSV using a variable field stop that enables the light to be focused at the inlet and bottom surface of the TSV thereby reducing the measurement time and capacity of the result data, and a measurement method using the same.

What is claimed is:

1. An interferometer for measuring a TSV, the interferometer comprising:
 a beam splitter configured to split an injected light generated from a light source into a first light oriented towards a first direction and a second light oriented towards a second direction that is perpendicular to the first direction, and to combine the first light and the second light to output a combined light;
 a mirror configured to reflect the first light input from the beam splitter back to the beam splitter and disposed in the first direction, and a measurement object where at least one TSV is formed and configured to reflect the second light input from the beam splitter back to the beam splitter and disposed in the second direction;
 a photographing means configured to receive the combined light output from the beam splitter after being reflected from the mirror and measurement object, and where an interference signal is formed by the combined light;
 an object lens disposed between the beam splitter and photographing means or between the beam splitter and measurement object; and
 a variable field stop disposed between the beam splitter and photographing means, wherein the variable field stop is passed by the second light focused at a reference location that is an inlet of the TSV or at a variable location that is a bottom surface of the TSV to optimize an image obtained as the second light focused at the reference location or the variable location is received at the photographing means,
 wherein the interferometer measures a diameter and height of the TSV based on an interference signal when the second light towards the measurement object is focused at the reference position and an interference signal when the second light towards the measurement object is focused at the variable position; and wherein the variable field stop comprises a first opening that is passed by the second light focused at the reference location that is the inlet of the TSV and a second opening that is passed by the second light focused at a variable location that is the bottom surface of the TSV, wherein a size of the first opening is optimized to obtain an image for the inlet of the TSV and a size of the second opening is optimized to obtain an image for the bottom surface of the TSV.

2. The interferometer for measuring a TSV according to claim 1, wherein the light output from the object lens is a straight light.

3. The interferometer for measuring a TSV according to claim 1, wherein the object lens is a telecentric lens.

4. The interferometer for measuring a TSV according to claim 1, wherein the size of the first opening is between 10 mm to 14 mm, and the size of the second opening is between 0.1 mm to 4.5 mm.

5. A measurement method using the interferometer of claim 1 for measuring a TSV that generates a light, splits the light into a first light and a second light and outputs the first light and the second light in a first direction and second direction, respectively, that are perpendicular to each other, the first light and the second light then reflected by a mirror and measurement object disposed in the first direction and second direction, respectively, re-input into the beam splitter to form an interference signal on a photographing means, the method comprising:

adjusting the variable field stop such that the measurement object is focused at a reference location that is an inlet of a TSV formed on the measurement object;

generating a light, splitting the light through the beam splitter, and receiving two reflected lights and combining the two received lights to form a first interference signal;

adjusting the variable field stop so that the split light towards the measurement object is focused at a variable location that is a bottom surface of the TSV formed on the measurement object;

generating a light, splitting the light through the beam splitter, receiving two reflected lights and combining the two received lights to form a second interference signal; and analyzing the first interference signal and second interference signal to measure a diameter and depth of the TSV.

6. The method according to claim 5, wherein the light output to the measurement object is a straight light.

* * * * *